(12) United States Patent
Song et al.

(10) Patent No.: US 11,538,968 B2
(45) Date of Patent: Dec. 27, 2022

(54) DISPLAY DEVICE AND MANUFACTURING METHOD THEREOF

(71) Applicant: SAMSUNG DISPLAY CO., LTD., Yongin-si (KR)

(72) Inventors: Daeho Song, Hwaseong-si (KR); Minwoo Kim, Hwaseong-si (KR); Byungchoon Yang, Seoul (KR); Hyung-Il Jeon, Seoul (KR); Jinwoo Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/839,932

(22) Filed: Apr. 3, 2020

(65) Prior Publication Data

US 2020/0328332 A1 Oct. 15, 2020

(30) Foreign Application Priority Data

Apr. 9, 2019 (KR) .................. 10-2019-0041351

(51) Int. Cl.
*H01L 33/58* (2010.01)
*H01L 33/00* (2010.01)
*H01L 25/075* (2006.01)
*H01L 33/62* (2010.01)

(52) U.S. Cl.
CPC .......... *H01L 33/58* (2013.01); *H01L 25/0753* (2013.01); *H01L 33/0095* (2013.01); *H01L 33/62* (2013.01); *H01L 2933/0058* (2013.01); *H01L 2933/0066* (2013.01)

(58) Field of Classification Search
CPC combination set(s) only.
See application file for complete search history.

(56) References Cited

U.S. PATENT DOCUMENTS

| 10,043,784 | B2 | 8/2018 | Sakariya et al. | |
|---|---|---|---|---|
| 2010/0025709 | A1* | 2/2010 | Koseki | H01L 33/56 257/E33.059 |
| 2012/0007119 | A1* | 1/2012 | Shiobara | H01L 33/60 257/E33.061 |
| 2016/0181476 | A1 | 6/2016 | Chang et al. | |
| 2017/0054062 | A1* | 2/2017 | Tamaki | H01L 33/507 |
| 2018/0083218 | A1* | 3/2018 | Choi | H01L 51/5275 |
| 2018/0122836 | A1* | 5/2018 | Kang | H01L 33/54 |
| 2018/0175268 | A1* | 6/2018 | Moon | H01L 27/15 |
| 2018/0197844 | A1 | 7/2018 | Higginson et al. | |
| 2018/0308420 | A1 | 10/2018 | Shin et al. | |
| 2018/0340681 | A1 | 11/2018 | Cok | |
| 2019/0305170 | A1* | 10/2019 | Nakamoto | H01L 31/12 |
| 2020/0198969 | A1* | 6/2020 | Kageyama | G03F 7/0047 |

FOREIGN PATENT DOCUMENTS

| KR | 10-2017-0112304 A | 10/2017 |
|---|---|---|
| KR | 10-1837362 B1 | 4/2018 |
| KR | 10-2018-0073971 A | 7/2018 |
| KR | 10-2018-0118488 A | 10/2018 |

* cited by examiner

*Primary Examiner* — Ratisha Mehta
(74) *Attorney, Agent, or Firm* — Lewis Roca Rothgerber Christie LLP

(57) ABSTRACT

A display device and a manufacturing method of a display device are provided. A display device includes a base substrate; an electrode on the base substrate, a light emitting element on the base substrate and electrically connected to the electrode, and a solution layer between the base substrate and the light emitting element, the solution layer including a light blocking material.

20 Claims, 12 Drawing Sheets

DISPLAY DEVICE AND MANUFACTURING METHOD THEREOF

CROSS-REFERENCE TO RELATED APPLICATIONS

This patent application claims priority to and the benefit of Korean Patent Application No. 10-2019-0041351, filed on Apr. 9, 2019 in the Korean Intellectual Property Office, the entire content of which is hereby incorporated by reference.

BACKGROUND

1. Field

Aspects of embodiments of the present disclosure relate to a display device and a manufacturing method thereof.

2. Description of the Related Art

A light emitting diode (LED) is a device for converting an electric signal into a type of light including an infrared ray, a visible ray, or the like, using the characteristics of a compound semiconductor, and may be used in a home appliance, a remote controller, an electronic board, or various kinds of automation devices. A usage area of the LED is being gradually extended in a wide range of electronic devices, from a small hand-held electronic device to a large-scale display device.

The LED may include a p-type semiconductor layer, an n-type semiconductor layer, and at least one quantum well layer interposed between the p-type semiconductor layer and the n-type semiconductor layer.

SUMMARY

According to an aspect of embodiments of the present disclosure, a display device in which reflection of external light is prevented or substantially prevented to improve the reliability, and a manufacturing method thereof are provided. According to an aspect of embodiments of the present disclosure, a display device including a transparent light emitting diode is provided, in which an issue that incident external light may be transmitted through the transparent light emitting diode and reflected by a reflection electrode, and thus the reflection electrode or the like may be viewed is prevented or substantially prevented to improve the reliability of the display device, and a manufacturing method thereof is provided.

According to one or more embodiments of the inventive concept, a display device includes: a base substrate; an electrode on the base substrate; a light emitting element on the base substrate and electrically connected to the electrode; and a solution layer between the base substrate and the light emitting element, wherein the solution layer includes a light blocking material.

In an embodiment, the light emitting element may include a contact part contacting the electrode, and the solution layer surrounds the contact part.

In an embodiment, the electrode may include a first electrode and a second electrode spaced apart from the first electrode, and the contact part may include: a first contact part connected to the first electrode; and a second contact part connected to the second electrode.

In an embodiment, the light emitting element may further include: a base layer; a first semiconductor layer on the base layer; a second semiconductor layer on the first semiconductor layer; a first element electrode on the second semiconductor layer and connected to the first contact part; and a second element electrode on the first semiconductor layer and connected to the second contact part.

In an embodiment, the light emitting element may further include an element insulation layer covering at least a part of the first element electrode and the second element electrode, and the solution layer is in contact with the first contact part, the second contact part, and the element insulation layer.

In an embodiment, the electrode may include gold (Au) or copper (Cu).

In an embodiment, the solution layer may include a water-soluble solvent and a sodium salt dissolved in the water-soluble solvent, wherein the sodium salt may have a black color.

In an embodiment, the solution layer may include an organic solvent and a black organic pigment dispersed in the organic solvent.

In an embodiment, the display device may further include: a pixel definition layer on the base substrate and covering a part of the electrode, wherein an opening which exposes a portion other than the part of the electrode is defined in the pixel definition layer, and the light emitting element and the solution layer are located in the opening.

In an embodiment, the light emitting element may be a micro LED element.

In an embodiment, the display device may further include a planarization layer on the light emitting element and the solution layer.

In an embodiment, the contact part may include tin (Sn), and further include at least one of copper (Cu), silver (Ag), or gold (Au).

In one or more embodiments of the inventive concept, a manufacturing method of a display device includes: forming an electrode on a base substrate; forming a solution layer by providing a solution including a light blocking material on the electrode; transferring a light emitting element such that the light emitting element passes through the solution layer and is electrically connected to the electrode; and bonding the light emitting element with the electrode by applying light or heat to a part at which the light emitting element is connected to the electrode.

In an embodiment, the light emitting element may include a contact part, and, during the transferring of the light emitting element, the transferring is performed such that the contact part contacts the electrode.

In an embodiment, the electrode may include copper (Cu) or gold (Au), the contact part may include tin (Sn), and, during the applying the light or the heat, the contact part may be bonded with the electrode.

In an embodiment, during the forming of the electrode, a first electrode and a second electrode spaced apart from the first electrode may be formed, the contact part may include a first contact part, and a second contact part spaced apart from the first contact part, and, during the transferring of the light emitting element, the transferring may be performed such that the first contact part is connected to the first electrode, and the second contact part is connected to the second electrode.

In an embodiment, during the transferring of the light emitting element, the transferring may be performed such that the contact part and the electrode are entirely covered with the solution layer.

In an embodiment, the manufacturing method may further include removing the solution layer, after the bonding of the light emitting element and the electrode.

In an embodiment, the manufacturing method may further include forming, on the base substrate, a pixel definition layer covering a part of the electrode, wherein, during the transferring of the light emitting element, the light emitting element is transferred in an opening of the pixel definition layer, the opening being defined to expose a portion other than the part of the electrode.

In an embodiment, during the bonding of the light emitting element and the electrode, a part at which the light emitting element is connected to the electrode may be irradiated with light through an infrared laser, or may be applied with heat through at least one of an IR reflow oven, a convection oven, or a hot plate.

BRIEF DESCRIPTION OF THE FIGURES

The accompanying drawings are included to provide a further understanding of the inventive concept, and are incorporated in and constitute a part of this specification. The drawings illustrate some example embodiments of the inventive concept and, together with the description, serve to explain principles of the inventive concept. In the drawings.

DETAILED DESCRIPTION

Figure 1:
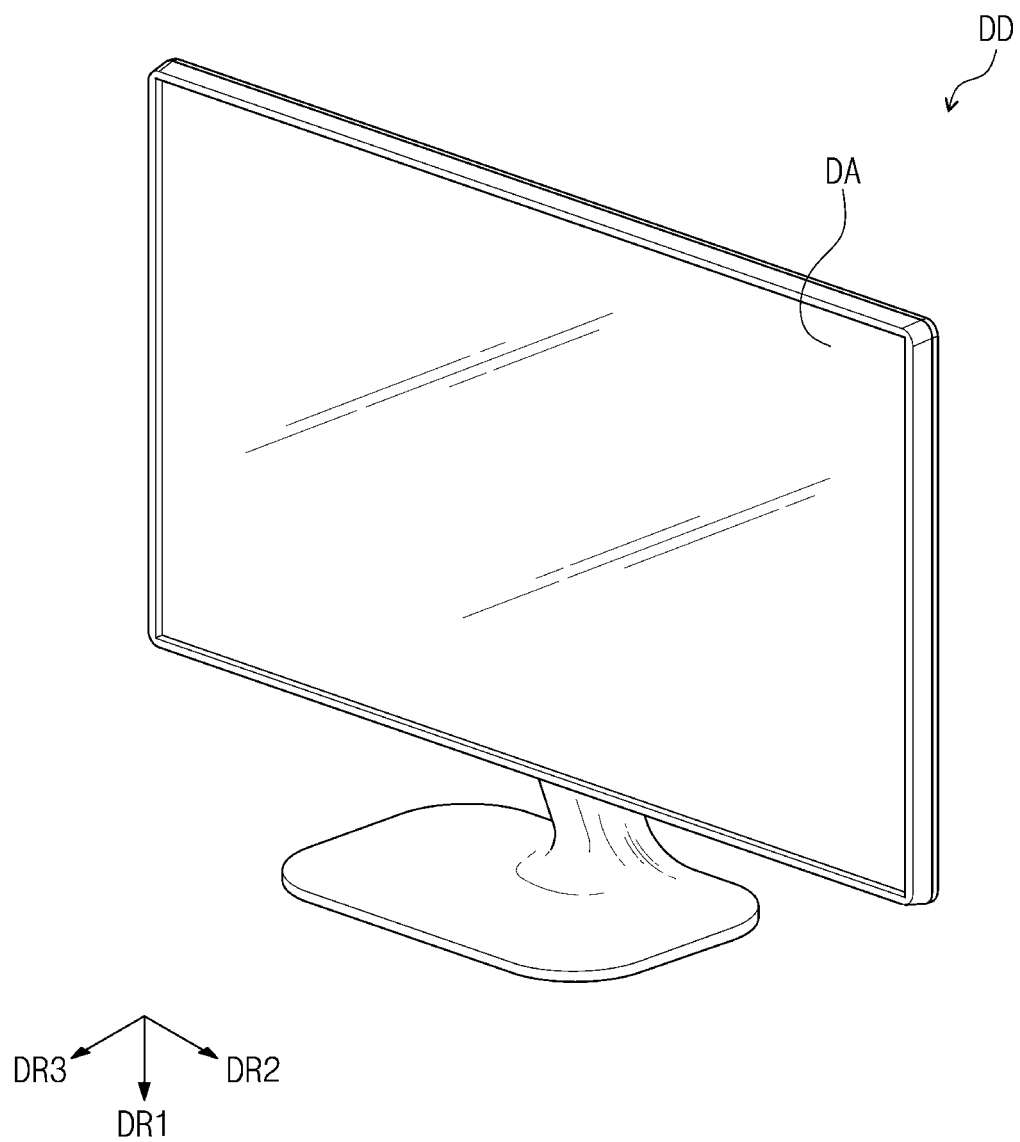
FIG. 1 is a perspective view of a display device according to an embodiment of the inventive concept.

Embodiments of the inventive concept will be described below in further detail with reference to the accompanying drawings. The present invention may be variously modified and realized in various forms, and, thus, some example embodiments will be exemplified in the drawings and described in further detail herein. However, it is to be understood that the present invention is not intended to be limited to the specific forms set forth herein, and all changes, equivalents, and substitutions included in the technical scope and spirit of the present invention are included.

Referring to the drawings, like reference numerals refer to like components throughout. In the drawings, the dimensions of structures may be exaggerated for clarity of illustration. Terms such as "first," "second," and the like may be used to describe various components, but these components should not be limited by the terms. The terms are used for the purpose of distinguishing one component from another component. For instance, a first component may be referred to as a second component or, similarly, a second component may be referred to as a first component, without departing from the scope of the present disclosure. The singular forms "a," "an," and "the" are intended to include the plural forms as well, unless the context clearly indicates otherwise.

It is to be further understood that the terms "comprises," "comprising," "includes," and/or "including," when used herein, specify the presence of stated features, integers, steps, operations, elements, components, or combinations thereof, but do not preclude the presence or addition of one or more other features, integers, steps, operations, elements, components, or combinations thereof.

It is also to be understood that when a part, such as a layer, a film, a region, or a plate, etc., is referred to as being "on" or "above" another part, it may be directly on the other part, or one or more intervening parts may also be present. Further, for example, it is to be understood that when a part such as a layer, a film, a region, or a plate, etc., is referred to as being "under" another part, it may be directly under the other part, or one or more intervening parts may also be present. In addition, being disposed "on" may encompass an orientation of above and below.

Meanwhile, "directly contacting" may mean that there is not an additional layer, film, region, plate, or the like between a part, such as a layer, film, region, or plate and another part. For example, "directly contacting" may mean that an additional member, such as an adhesive member, is not used between two layers or two members.

Unless otherwise defined, all terms used herein (including technical or scientific terms) have the same meanings as those generally understood by those skilled in the art to which the inventive concept pertains. Such terms as those defined in a generally used dictionary are to be interpreted as having meanings equal to the contextual meanings in the relevant field of art, and are not to be interpreted as having idealized or excessively formal meanings unless clearly defined herein.

Herein, a display device according to an embodiment of the inventive concept will be described with reference to the drawings.

FIG. 1 is a perspective view of a display device according to an embodiment of the inventive concept.

Referring to FIG. 1, a display device DD may display an image through a display area DA. FIG. 1 exemplarily illustrates that the display area DA is provided on a surface defined by a first direction DR1 and a second direction DR2 intersecting with the first direction DR1. However, embodiments of the inventive concept are not limited thereto, and, in another embodiment of the inventive concept, the display area of the display device may be provided on a curved surface.

A thickness direction of the display device DD is indicated by a third direction DR3. Directions indicated by the first to third directions DR1, DR2, and DR3 are relative concepts and may be changed to other directions. In the present disclosure, the wording "in a plan view" may represent a case of being viewed in the third direction DR3. In addition, "thickness direction" may represent the third direction DR3.

In FIG. 1, the display device DD is exemplarily illustrated as a television. However, the display device DD may be used not only in a large electronic device, such as an external billboard, but also in a small or medium electronic device, such as a personal computer, a notebook computer, a personal digital assistant, a car navigation unit, a game console, a smartphone, a tablet, or a camera. In addition, these devices are only enumerated as an example embodiment, and the display device DD may also be employed in other electronic devices without being deviated from the inventive concept.

Figure 2:
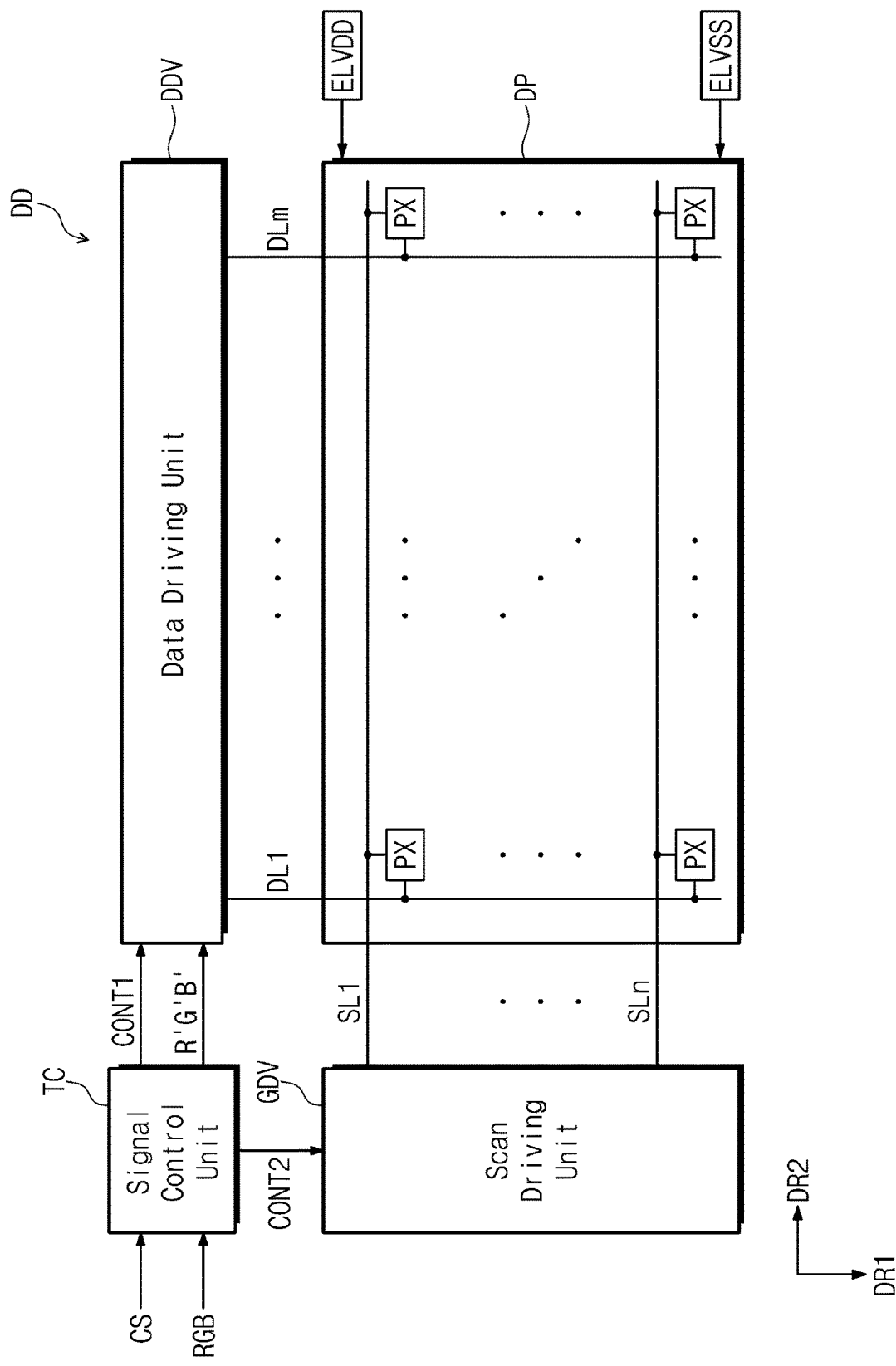
FIG. 2 is a block diagram of a display device according to an embodiment of the inventive concept.

FIG. 2 is a block diagram of a display device according to an embodiment of the inventive concept.

Referring to FIG. 2, the display device DD may include a display panel DP, a signal control unit (or timing controller) TC, a data driving unit DDV, and a scan driving unit GDV. Each of the signal control unit TC, the data driving unit DDV, and the scan driving unit GDV may include a circuit.

In an embodiment, the display panel DP may be a micro-miniature light emitting element display panel DP including a micro-miniature light emitting element. For example, the display panel DP may be a micro LED display panel.

The display panel DP may include a plurality of data lines DL1 to DLm, a plurality of scan lines SL1 to SLn, and a plurality of pixels PX.

The plurality of data lines DL1 to DLm may extend in the first direction DR1 and may be arranged along the second direction DR2 intersecting with the first direction DR1. The plurality of scan lines SL1 to SLn may extend in the second direction DR2 and may be arranged along the first direction DR1.

Each of the pixels PX may include a light emitting element ED (see FIG. 3) and a pixel circuit PXC (see FIG. 3) electrically connected to the light emitting element ED. The pixel circuit PXC (see FIG. 3) may include a plurality of transistors TR1 and TR2 (see FIG. 3). A first power supply voltage ELVDD and a second power supply voltage ELVSS may be provided to each of the pixels PX.

The pixels PX may be disposed in a regular pattern in a plan view of the display panel DP. Each pixel PX may display one among primary colors or one among mixed colors. The primary colors may include red, green, and blue, and the mixed colors may include various colors, such as yellow, cyan, magenta, and white. However, the color displayed by the pixel PX is not limited thereto.

The signal control unit TC may receive image data RGB provided from the outside. The signal control unit TC converts the image data RGB so as to be suitable for an operation of the display panel DP to generate converted image data R'G'B', and outputs the converted image data R'G'B' to the data driving unit DDV.

In addition, the signal control unit TC may receive a control signal CS provided from the outside. The control signal CS may include a vertical synchronization signal, a horizontal synchronization signal, a main clock signal, a data enable signal, and the like.

The signal control unit TC provides a first control signal CONT1 to the data driving unit DDV, and a second control signal CONT2 to the scan driving unit GDV. The first control signal CONT1 is for controlling the data driving unit DDV, and the second control signal CONT2 is for controlling the scan driving unit GDV.

The data driving unit DDV may provide electrical signals to the plurality of data lines DL1 to DLm in response to the first control signal CONT1 received from the signal control unit TC. In an embodiment, the data driving unit DDV may be realized as a separate integrated circuit and may be electrically connected to one side of the display panel DP or may be directly mounted on the display panel DP. In addition, the data driving unit DDV may be realized as a single chip or include a plurality of chips.

The scan driving unit GDV may provide electrical signals to the plurality of scan lines SL1 to SLn in response to the second control signal CONT2 received from the signal control unit TC. In an embodiment, the scan driving unit GDV may be integrated in a prescribed area of the display panel DP. For example, the scan driving unit GDV may include a plurality of transistors formed through a same process as that of the pixel circuit PXC (see FIG. 3) of the pixels PX, for example, a low temperature polycrystalline silicon (LTPS) process or a low temperature polycrystalline oxide (LTPO) process. In another embodiment of the inventive concept, the scan driving unit GDV may be realized as a separate integrated circuit chip to be electrically connected to one side of the display panel DP.

While a gate-on voltage is applied to one of the plurality of scan lines SL1 to SLn, each switching transistor in one row of pixels PX connected to the one scan line is turned on. At this point, the data driving unit DDV provides data driving signals to the data lines DL1 to DLm. The data driving signals provided to the data lines DL1 to DLm are applied to respectively corresponding pixels PX through the turned-on switching transistors. The data driving signals may be analog voltages corresponding to gradation values of pieces of the image data.

Figure 3:
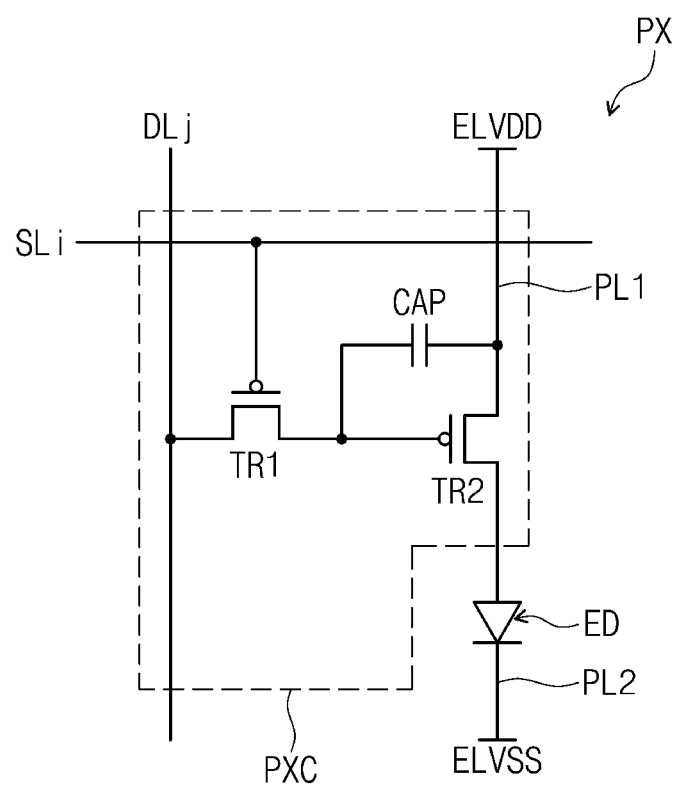
FIG. 3 is an equivalent circuit diagram of a pixel according to an embodiment of the inventive concept.

FIG. 3 is an equivalent circuit diagram of a pixel according to an embodiment of the inventive concept. FIG. 3 illustrates an equivalent circuit diagram of one pixel PX (herein, pixel) among the plurality of pixels PX illustrated in FIG. 2.

Referring to FIG. 3, the pixel PX may be connected to a plurality of signal lines. In the present embodiment, among the plurality of signal lines, a scan line SLi, a data line DLj, a first power line PL1, and a second power line PL2 are exemplarily illustrated. However, this illustration is merely an example, and the pixel PX according to an embodiment of the inventive concept may be additionally connected to various signal lines and is not limited to any particular embodiment.

The pixel PX may include the light emitting element ED and the pixel circuit PXC. The pixel circuit PXC may include a first transistor TR1, a capacitor CAP, and a second transistor TR2. This illustration is merely an example, and the numbers of the transistors and the capacitors included in the pixel circuit PXC are not limited to those shown in FIG. 3. For example, the pixel circuit PXC may include seven transistors and one capacitor in another embodiment of the inventive concept.

The first transistor TR1 may be a switching transistor for controlling on or off of the pixel PX. The first transistor TR1 may deliver or cut off a data signal delivered through the data line DLj in response to a scan signal delivered through the scan line SLi.

The capacitor CAP is connected to the first transistor TR1 and the first power line PL1. The capacitor CAP is charged with an amount of charges corresponding to a difference between the data signal delivered from the first transistor TR1 and the first power supply voltage ELVDD applied to the first power line PL1.

The second transistor TR2 is connected to the first transistor TR1, the capacitor CAP, and the light emitting element ED. The second transistor TR2 controls a driving current flowing through the light emitting element ED according to the charge amount stored in the capacitor CAP. A turn-on time of the second transistor TR2 may be determined according to the charge amount stored in the capacitor CAP.

Each of the first transistor TR1 and the second transistor TR2 may be an n-type transistor or a p-type transistor. In another embodiment of the inventive concept, one of the first transistor TR1 and the second transistor TR2 may be an n-type transistor, and the other may be a p-type transistor.

The light emitting element ED may be electrically connected to the second transistor TR2 and the second power line PL2. The light emitting element ED may receive the second power supply voltage ELVSS through the second power line PL2.

The light emitting element ED may emit light at a voltage corresponding to a difference between a signal delivered through the second transistor TR2 and the second power supply voltage ELVSS received through the second power line PL2.

The light emitting element ED may be a micro light emitting diode (micro LED). The micro LED element may be an LED element having a length of several nanometers to hundred micrometers. However, this length of the micro LED element is only an example, and embodiments are not limited to the above numerical range. The light emitting element ED may emit light of a specific wavelength band. For example, the light emitting element ED may emit blue, red, or green light.

FIG. 3 illustrates, as an example, that one light emitting element ED is connected between the second transistor TR2 and the second power line PL2, but the light emitting element ED may be provided in plural. In an embodiment, a plurality of provided light emitting elements ED may be connected to each other in parallel.

Figure 4:
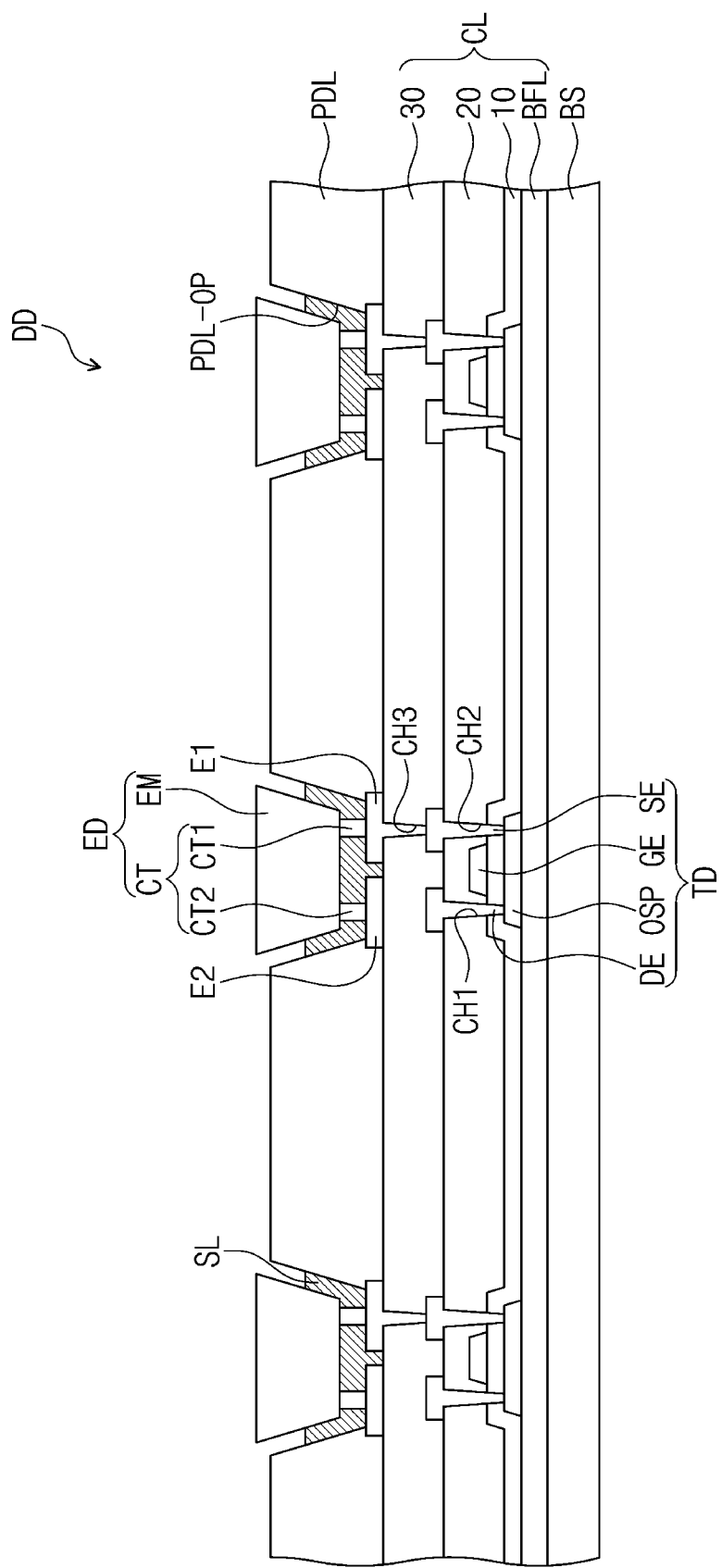
FIG. 4 is a cross-sectional view of a display device according to an embodiment of the inventive concept.

FIG. 4 is a cross-sectional view of a display device according to an embodiment of the inventive concept. FIG. 4 exemplarily illustrates a cross-section in which three pixels PX among the pixels PX illustrated in FIG. 2 are disposed side by side on a base substrate BS of the display device DD according to an embodiment of the inventive concept.

Referring to FIG. 4, the display device DD according to an embodiment of the inventive concept may include a base substrate BS, a circuit element layer CL disposed on the base substrate BS, and at least one light emitting element ED disposed on the circuit element layer CL.

In an embodiment, the base substrate BS may include a synthetic resin substrate or a glass substrate. The circuit element layer CL includes at least one insulation layer and a circuit element. The circuit element includes signal lines and a pixel driving circuit, etc. The circuit element layer CL may be formed through a process of forming an insulation layer, a semiconductor layer, and a conduction layer by coating, deposition, and the like, and a process of patterning the insulation layer, the semiconductor layer, and the conduction layer via a photolithography process.

In the present embodiment, the circuit element layer CL may include a buffer film BFL, a first insulation layer 10, a second insulation layer 20, and a third insulation layer 30. In an embodiment, the first insulation layer 10 and the second insulation layer 20 may be inorganic films, and the third insulation layer 30 may be an organic film. In an embodiment, the third insulation layer 30 may include polyimide (PI).

FIG. 4 exemplarily illustrates a disposition relationship between a semiconductor pattern OSP, a control electrode GE, an input electrode DE, and an output electrode SE, which constitute the driving transistor TD. First to third through-holes CH1, CH2, and CH3 are also illustrated as an example. However, embodiments of the inventive concept are not limited thereto, and the structure of the driving transistor TD may have any of various shapes for driving the light emitting element ED. For example, in an embodiment of the inventive concept, the driving transistor TD may have a shape in which the first transistor TR1 (see FIG. 3) and the second transistor TR2 (see FIG. 3) are connected through a connection electrode.

One or more electrodes E1 and E2 are disposed on the circuit element layer CL. A first electrode E1 and a second electrode E2 may be disposed on the circuit element layer CL. The first electrode E1 is disposed on the third insulation layer 30, and is electrically connected to the output electrode SE exposed through the third through-hole CH3.

The second electrode E2 may be disposed on the third insulation layer 30. Although not illustrated, the second electrode E2 may be electrically connected to the second power line PL2 (see FIG. 3). In other words, the second power supply voltage ELVSS (see FIG. 3) may be provided to the second electrode E2.

In an embodiment, the first electrode E1 and the second electrode E2 are disposed on the same layer, and may be disposed separately, or spaced apart from each other. In an embodiment, the first electrode E1 and the second electrode E2 may include a same conductive material. For example, each of the first electrode E1 and the second electrode E2 may include a reflective material. Each of the first electrode E1 and the second electrode E2 may have a single-layer structure or a laminate structure of a plurality of layers. In an embodiment, each of the first electrode E1 and the second electrode E2 may include molybdenum, silver, titanium, copper, aluminum, gold, or an alloy thereof. In an embodiment, each of the first electrode E1 and the second electrode E2 may include copper (Cu) or gold (Au). However, embodiments of the inventive concept are not limited thereto, and each of the first electrode E1 and the second electrode E2 may have a structure in which indium tin oxide (ITO), silver (Ag), and indium tin oxide (ITO) are sequentially laminated. For example, each of the first electrode E1 and the second electrode E2 may include at least one of indium zinc oxide (IZO), indium tin oxide (ITO), indium gallium oxide (IGO), indium zinc gallium oxide (IGZO), or a mixture/compound thereof.

The light emitting element ED may be disposed on the first electrode E1 and the second electrode E2, and electrically connected to the first electrode E1 and the second electrode E2.

The light emitting element ED may be transferred onto the first electrode E1 and the second electrode E2. For example, the light emitting element ED may be provided in plural, and the plurality of light emitting elements may be transferred substantially concurrently (e.g., simultaneously), or each of the plurality of light emitting element may be separately transferred.

A method for transferring the light emitting element ED onto the first electrode E1 and the second electrode E2 may include any of a direct transfer method and a printing transfer method. The direct transfer method may be one in which the light emitting element ED is directly transferred or transported onto the first electrode E1 and the second electrode E2. The printing transfer method may be one in which an electrostatic head, a flat stamp, or a roll stamp is used to transfer or transport the light emitting element ED onto the first electrode E1 and the second electrode E2.

The light emitting element ED may include a contact part CT and a main body part EM. The contact part CT may contact the first electrode E1 and the second electrode E2 so as to be electrically connected thereto. In an embodiment, the contact part CT may include a first contact part CT1 that contacts the first electrode E1 so as to be electrically connected thereto, and a second contact part CT2 that contacts the second electrode E2 so as to be electrically connected thereto. As shown in FIG. 4, when the first contact part CT1 and the second contact part CT2 are disposed side by side under the main body part EM, the light emitting element ED according to an embodiment may be a horizontal light emitting element.

The contact part CT may include a metal. In an embodiment, the contact part CT may include tin (Sn). In an embodiment, the contact part CT may include tin, and further include at least one of copper (Cu), silver (Ag) or gold (Au). In an embodiment, the contact part CT may be an alloy of tin/gold, or an alloy of tin/silver/copper.

The main body part EM may include at least one semiconductor layer and an active layer, and substantially generate light by an electrical signal. Herein, the configuration of the main body part EM of the light emitting element ED will be described in further detail with reference to FIGS. 7 and 8.

A pixel definition layer PDL may be disposed on the third insulation layer 30. The pixel definition layer PDL may cover a part of the first electrode E1 and the second electrode E2, and expose the remaining part other than the part that is covered. In further detail, an opening PDL-OP, which corresponds to a pixel area, is defined in the pixel definition layer PDL to cover a periphery of the first electrode E1 and the second electrode E2, and to expose the remaining part of the first electrode E1 and the second electrode E2 by the opening PDL-OP. The pixel definition layer PDL may include a light blocking material. The light blocking material included in the pixel definition layer PDL may be the same as that included in a solution layer SL that will be described later. In an embodiment of the inventive concept, the pixel definition layer PDL may be omitted.

Although not illustrated, in an embodiment, a separate light blocking pattern may be disposed on or under the pixel definition layer PDL. The light blocking pattern may be disposed on the top surface of the pixel definition layer PDL, or may be disposed between the third insulation layer 30 and the pixel definition layer PDL. The light blocking pattern may include a light blocking material. In an embodiment, the light blocking pattern may include a light blocking material having a black color. The light blocking material included in the light blocking pattern may be the same as that included in the solution layer SL that will be described later.

The solution layer SL is disposed among the first electrode E1, the second electrode E2, and the light emitting element ED. The solution layer SL may cover exposed top surfaces of the first electrode E1 and the second electrode E2. The solution layer SL may fill a separation part or region defined between the first electrode E1 and the second electrode E2, and contact the top surface of the third insulation layer 30 exposed by the separation part.

The solution layer SL may contact the contact part CT of the light emitting element ED, which contacts the first electrode E1 and the second electrode E2. In an embodiment, the solution layer SL may entirely cover the contact part CT of the light emitting element ED. In further detail, the contact part CT may include side surfaces defined between the top surface connected to the main body part EM and the bottom surface connected to the electrodes E1 and E2, and the solution layer SL may entirely cover the exposed side surfaces of the contact part CT. The solution layer SL may contact the contact part CT and the main body part EM of the light emitting element ED, and cover a part of the bottom surface and side surfaces of the main body part EM.

The solution layer SL may include a solvent and a light blocking material. In an embodiment, the solution layer SL may include a water-soluble solvent and a water-soluble light blocking material decomposed in the water-soluble solvent. The water-soluble light blocking material may include a sodium salt. In an embodiment, the water-soluble light blocking material may have a black color.

In an embodiment, the solution layer SL may include an organic solvent and a black organic pigment dispersed in the organic solvent. The organic solvent may be, for example, acetone, ethanol, or the like. The black pigment dispersed in the organic solvent may be, for example, aniline black, carbon black, graphite, or the like.

The solution layer SL may include the light blocking material to block external light. If the solution layer SL included a transparent or translucent material, the external light would be incident and reflected by the electrodes E1 and E2 that include a reflective material, and, thus the electrodes E1 and E2 or the like may be viewed from the outside. However, in the display device DD according to an embodiment of the inventive concept, the solution layer SL that includes the light blocking material is disposed between the light emitting element ED and the electrodes E1 and E2 to effectively block the external light, and, accordingly, an issue that the electrode or the like disposed in the inside may be viewed from the outside may be prevented or substantially prevented.

Figure 5:
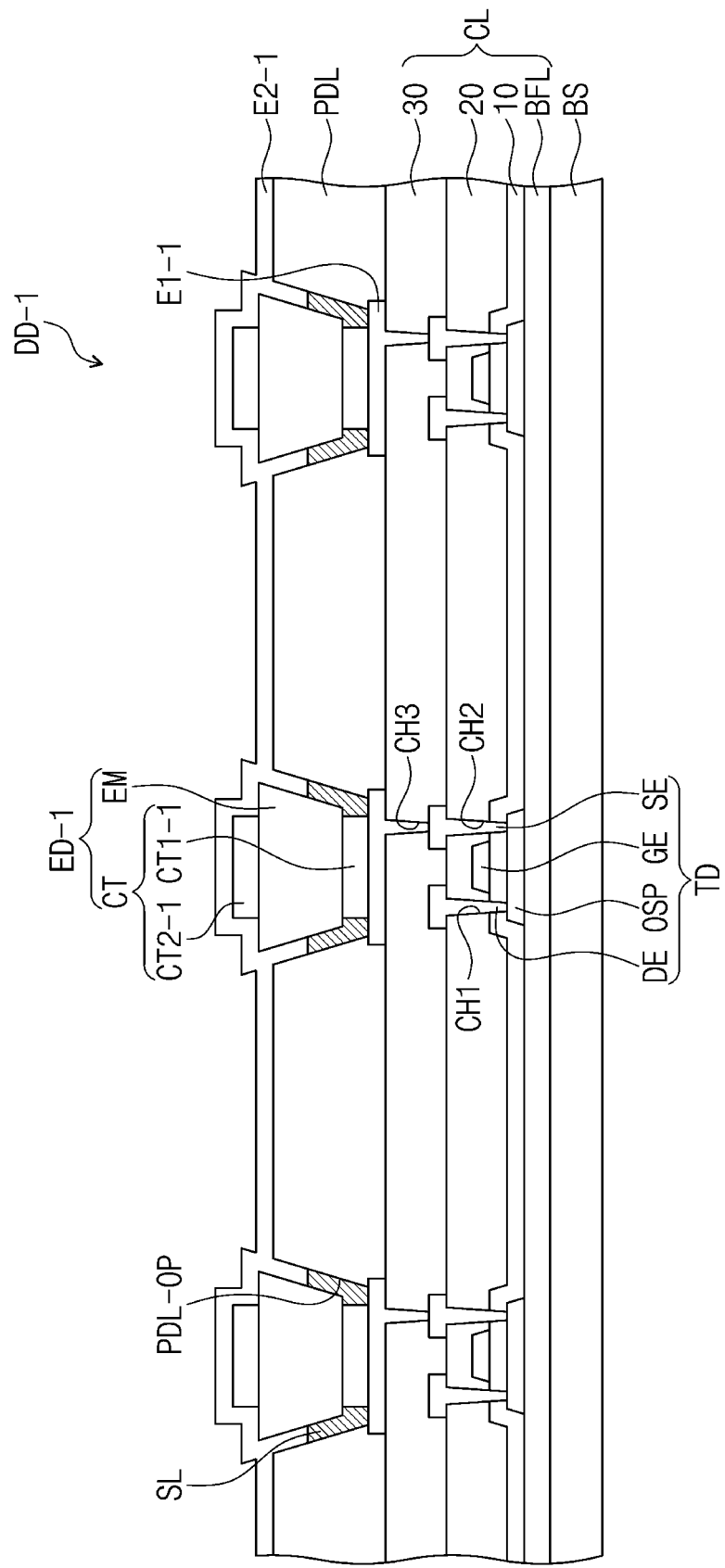
FIG. 5 is a cross-sectional view of a display device according to another embodiment of the inventive concept.
Figure 6:
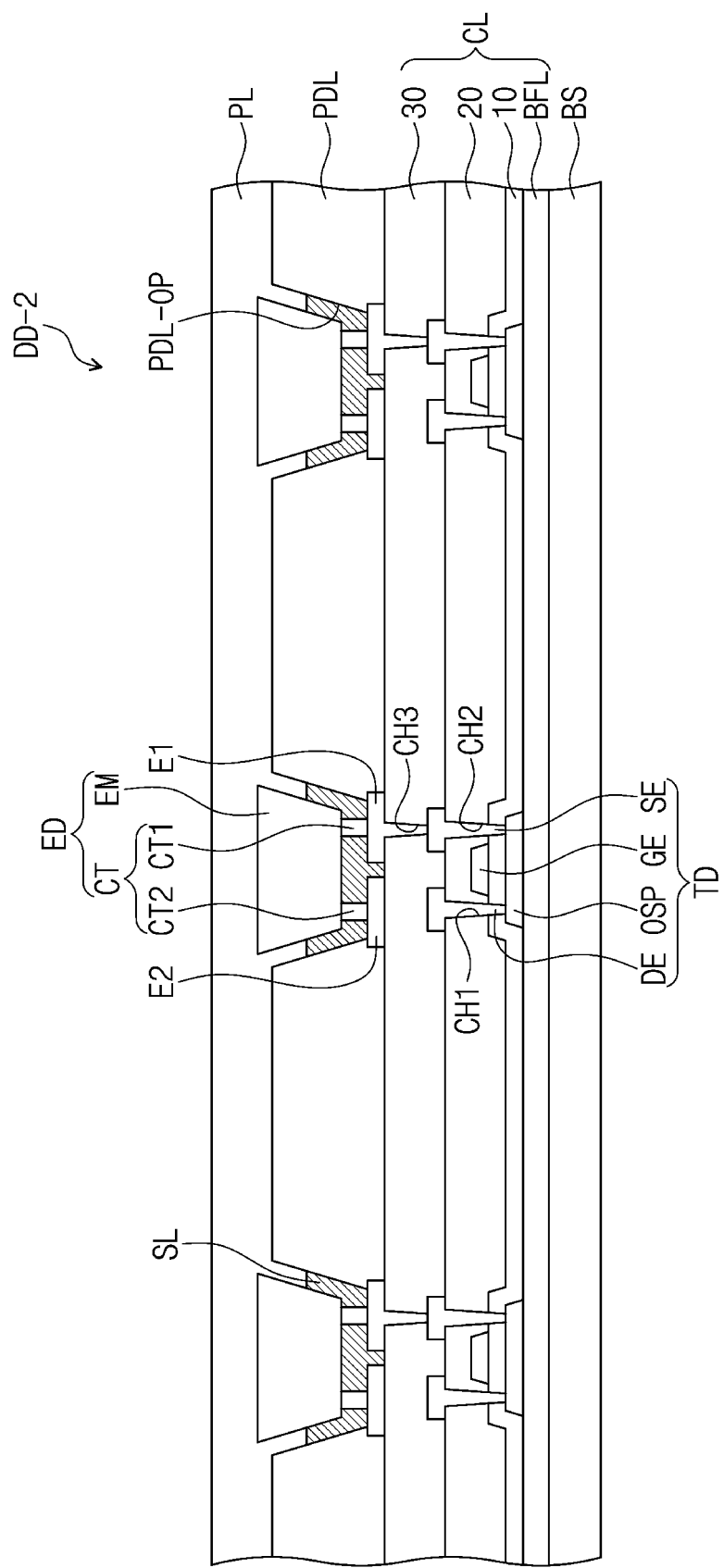
FIG. 6 is a cross-sectional view of a display device according to another embodiment of the inventive concept.

FIGS. 5 and 6 are cross-sectional views of a display device according to other embodiments of the inventive concept. Herein, when describing display devices DD-1 and DD-2 of FIGS. 5 and 6, the same reference numerals may be given to the above-described elements in FIG. 4, and repeated descriptions thereof may be omitted.

Referring to FIG. 5, the display device DD-1 according to an embodiment of the inventive concept may include a vertical light emitting element ED-1. In the light emitting element ED-1, a first contact part CT1-1 and a second contact part CT2-1 may be respectively disposed in a lower portion and an upper portion of the main body part EM.

As the display device DD-1 includes the vertical light emitting element ED-1, the first electrode E1-1 and the second electrode E2-1 may not be disposed on the same layer, but may be disposed so as to be respectively connected to the first contact part CT1-1 and the second contact part CT2-1. In further detail, the first electrode E1-1 may be disposed on the third insulation layer 30 so as to be electrically connected to the first contact part CT1-1, and the second electrode E2-1 may be disposed on the pixel definition layer PDL and the light emitting element ED-1 so as to be electrically connected to the second contact part CT2-1.

Referring to FIG. 6, the display device DD-2 according to an embodiment of the inventive concept may further include a planarization layer PL disposed between the light emitting element ED and the pixel definition layer PDL. The planarization layer PL may cover the light emitting element ED and the pixel definition layer PDL to provide a planarization surface to a top portion. The planarization layer PL may serve to remove and flatten a step caused by a height difference between the light emitting element ED and the pixel definition layer PDL, and cover the light emitting element ED to prevent or substantially prevent a foreign material from being entered.

Figure 7:
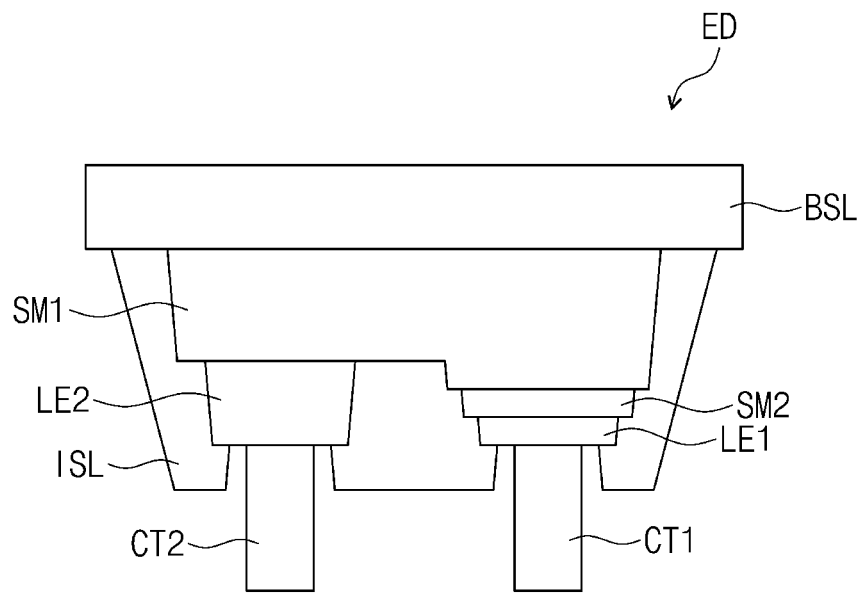
FIG. 7 is a cross-sectional view of a light emitting element according to an embodiment of the inventive concept.
Figure 8:
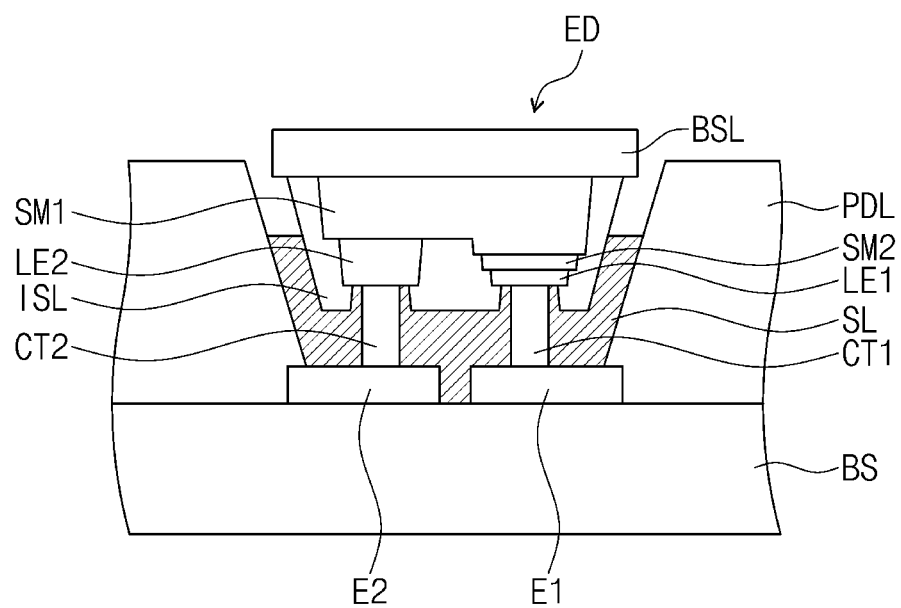
FIG. 8 a cross-sectional view illustrating a state in which a light emitting element according to an embodiment of the inventive concept is connected to an electrode.

FIG. 7 is a cross-sectional view of a light emitting element according to an embodiment of the inventive concept; and FIG. 8 is a cross-sectional view illustrating a state in which a light emitting element according to an embodiment of the inventive concept is connected to an electrode. In FIGS. 7 and 8, the light emitting element ED, namely, the horizontal light emitting element, included in the display device DD illustrated in FIG. 4 is exemplarily illustrated.

Referring to FIG. 7, the light emitting element ED according to an embodiment of the inventive concept may include a base layer BSL, a first semiconductor layer SM1, a second semiconductor layer SM2, a first element electrode LE1, a second element electrode LE2, a first contact part CT1, a second contact part CT2, and an element insulation layer ISL.

The base layer BSL may include a material having a light transmissive property, for example, any one of sapphire, GaN, ZnO, and A10. The base layer BSL is a substrate suitable for forming a semiconductor layer thereon, and may be formed of a carrier wafer. The base layer BSL may be a conductive substrate or an insulative substrate.

In the light emitting element ED according to an embodiment of the inventive concept, the first semiconductor layer SM1 may be disposed on the base layer BSL. The second semiconductor layer SM2 may be disposed on the first semiconductor layer SM1. In an embodiment, the first and second semiconductor layers SM1 and SM2 may be respectively an n-type semiconductor layer and a p-type semiconductor layer. The n-type semiconductor layer may be provided by doping a semiconductor layer with an n-type dopant, and the p-type semiconductor layer may be provided by doping a semiconductor layer with a p-type dopant. In an embodiment, the first semiconductor layer SM1 may be an n-type semiconductor layer, and the second semiconductor layer SM2 may be a p-type semiconductor layer.

Each of the first semiconductor layer SM1 and the second semiconductor layer SM2 may include a semiconductor material. The semiconductor material may be, for example, GaN, ALN, AlGaN, InGaN, InN, InAlGaN, or AlInN. The n-type dopant may be silicon (Si), germanium (Ge), tin (Sn), selenium (Se), tellurium (Te), or a combination thereof. The p-type dopant may be magnesium (Mg), zinc (Zn), calcium (Ca), strontium (Sr), or barium (Ba) or a combination thereof.

Although not illustrated, an active layer may be disposed between the first semiconductor layer SM1 and the second semiconductor layer SM2. The active layer may be formed of at least one of a single quantum well structure, a multiple quantum well structure, a quantum wire structure, or a quantum dot structure. The active layer may be a region in which an electron injected through the n-type semiconductor layer recombines with a hole injected through the p-type semiconductor layer. The active layer may be a layer from which light having energy determined by an energy band unique to a material is emitted. The position of the active layer may be changed in various ways according to the kind of the light emitting element ED.

The first element electrode LE1 may be disposed on the second semiconductor layer SM2. The second element electrode LE2 may be disposed on the first semiconductor layer SM1, and spaced apart from the second semiconductor layer SM2. In an embodiment, the second semiconductor layer SM2 may be disposed at a side of the first semiconductor layer SM1, and the second element electrode LE2 may be disposed at another side of the first semiconductor layer SM1 so as not to overlap the second semiconductor layer SM2 in a plan view. The first element electrode LE1 may be a p-type electrode with the first contact part CT1 being disposed thereon. The second element electrode LE2 may be an n-type electrode with the second contact part CT2 being disposed thereon.

The element insulation layer ISL may be disposed on and cover the first semiconductor layer SM1, the second semiconductor layer SM2, the first element electrode LE1, and the second element electrode LE2. The element insulation layer ISL may include a transparent or translucent insulation material, and be disposed between components of the light emitting element ED to insulate each component.

Referring to FIG. 8, the light emitting element ED may be disposed on the first electrode E1 and the second electrode E2, and electrically connected thereto. The first contact part CT1 and the second contact part CT2 of the light emitting element ED may pass through the solution layer SL so as to be electrically connected to the first electrode E1 and the second electrode E2. The first contact part CT1 may be connected to the first electrode E1, and the second contact part CT2 may be connected to the second electrode E2.

In an embodiment, the solution layer SL may contact each component of the light emitting element ED. The solution layer SL may be disposed to cover parts in which the contact parts CT1 and CT2 contact the electrodes E1 and E2, and to contact the element insulation layer ISL and the contact parts CT1 and CT2 of the light emitting element ED. In a state in which the light emitting element ED is connected to the electrodes E1 and E2, the first semiconductor layer SM1, the second semiconductor layer SM2, the first element electrode LE1, the second element electrode LE2, the first contact part CT1, and the second contact part CT2 of the light emitting element ED may be covered with the element insulation layer ISL and the solution layer SL so as not to be exposed to the outside.

Herein, a manufacturing method of a display device according to an embodiment of the inventive concept will be described with reference to the drawings.

Figure 9:
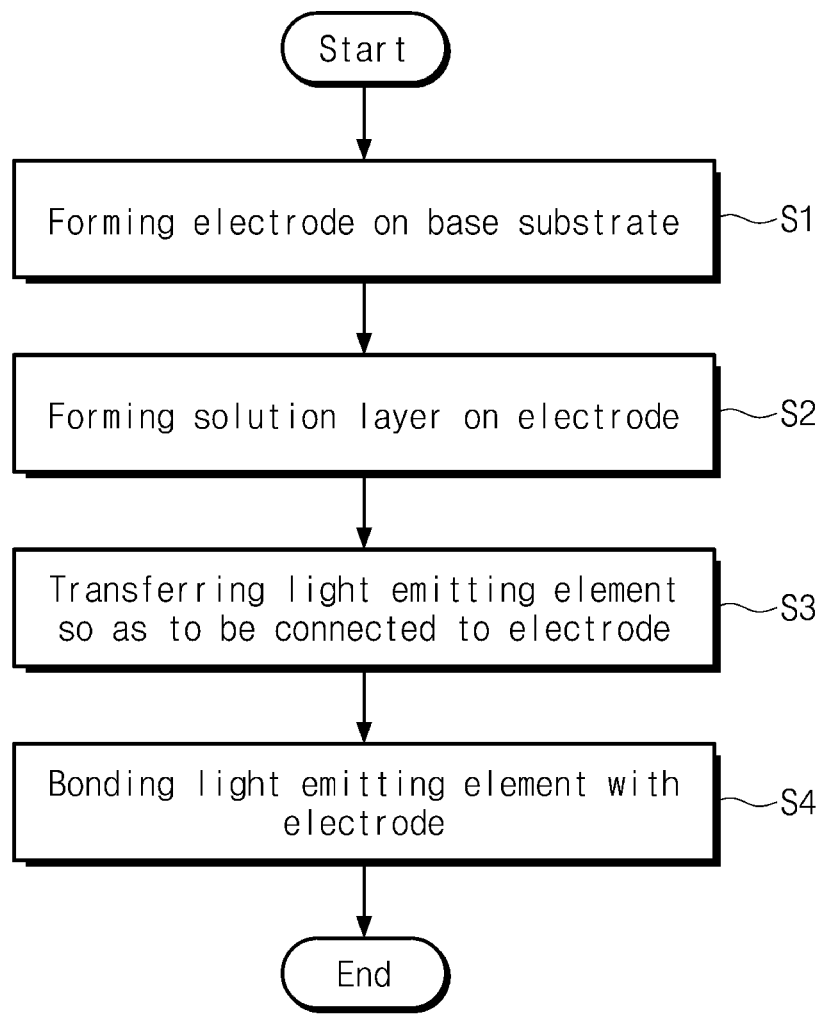
FIG. 9 is a flowchart illustrating a manufacturing method of a display device according to an embodiment of the inventive concept.

FIG. 9 is a flowchart illustrating a manufacturing method of a display device according to an embodiment of the inventive concept; and FIGS. 10A to 10E are cross-sectional views sequentially illustrating a manufacturing method of a display device according to an embodiment of the inventive concept.

Referring to FIG. 9, a manufacturing method of a display device according to an embodiment of the inventive concept includes a process S1 in which an electrode is formed on a base substrate, a process S2 in which a solution layer is formed on the electrode, a process S3 in which a light emitting element is transferred so as to pass through the solution layer and be electrically connected to the electrode, and a process S4 in which the light emitting element is bonded with the electrode.

Figure 10A:
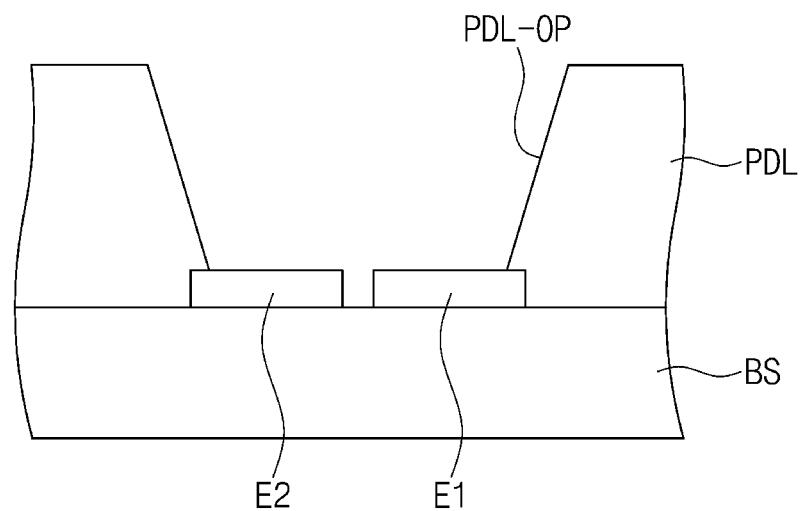
FIGS. 10A to 10E are cross-sectional views that sequentially illustrate a manufacturing method of a display device according to an embodiment of the inventive concept.

Referring to FIGS. 9 and 10A, the electrodes E1 and E2 are formed on the base substrate BS. The electrodes E1 and E2 may include the first electrode E1 and the second electrode E2. In an embodiment, the first electrode E1 and the second electrode E2 may be formed by depositing copper (Cu) or gold (Au) on the base substrate BS and then patterning the same.

In the manufacturing method of a display device according to an embodiment of the inventive concept, a process in which the pixel definition layer PDL is formed on the base substrate BS may be further included. The pixel definition layer PDL may be formed by coating an organic material, and then patterning an opening PDL-OP so as to expose a part of the electrodes E1 and E2. The pixel definition layer PDL may be formed by patterning an organic material including a light blocking material.

Figure 10B:
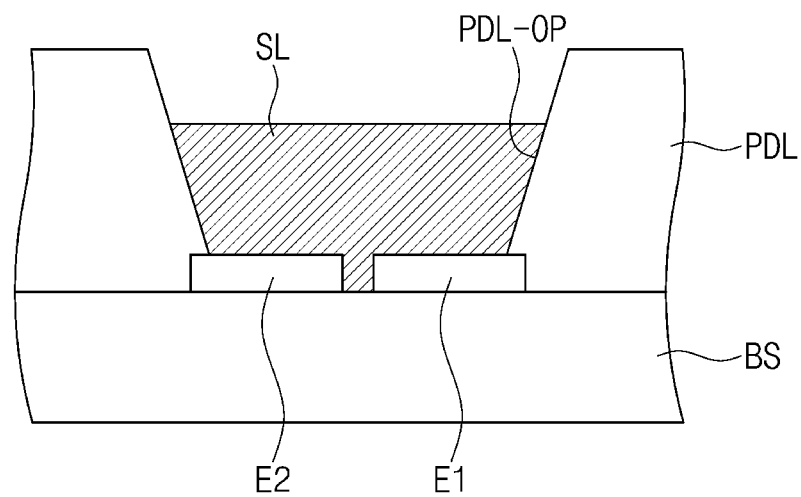

Referring to FIGS. 9 and 10B, the solution layer SL is formed by patterning a solution including the light blocking material on the electrodes E1 and E2. The solution layer SL may be formed of a solution in which the light blocking material is dispersed or dissolved in a solvent. The solution layer SL may be formed by patterning the solution including the light blocking material in the opening PDL-OP of the pixel definition layer PDL. The solution layer SL may be formed so as to fill a separation part defined between the first electrode E1 and the second electrode E2, and contact the top surface of the third insulation layer 30 exposed by the separation part.

Figure 10C:
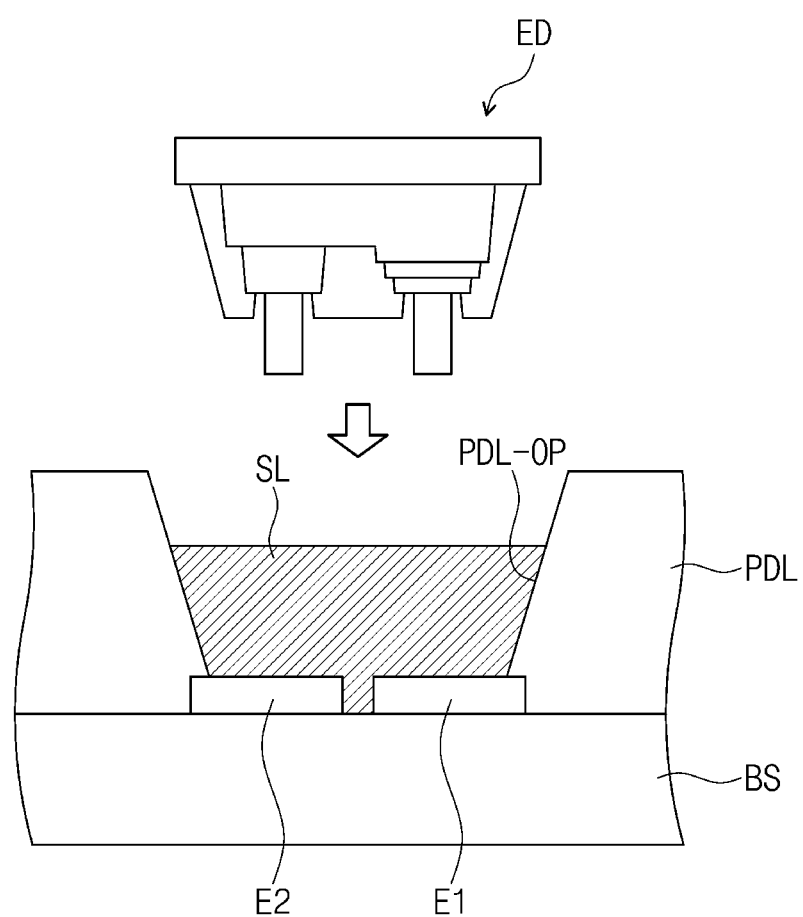
Figure 10D:
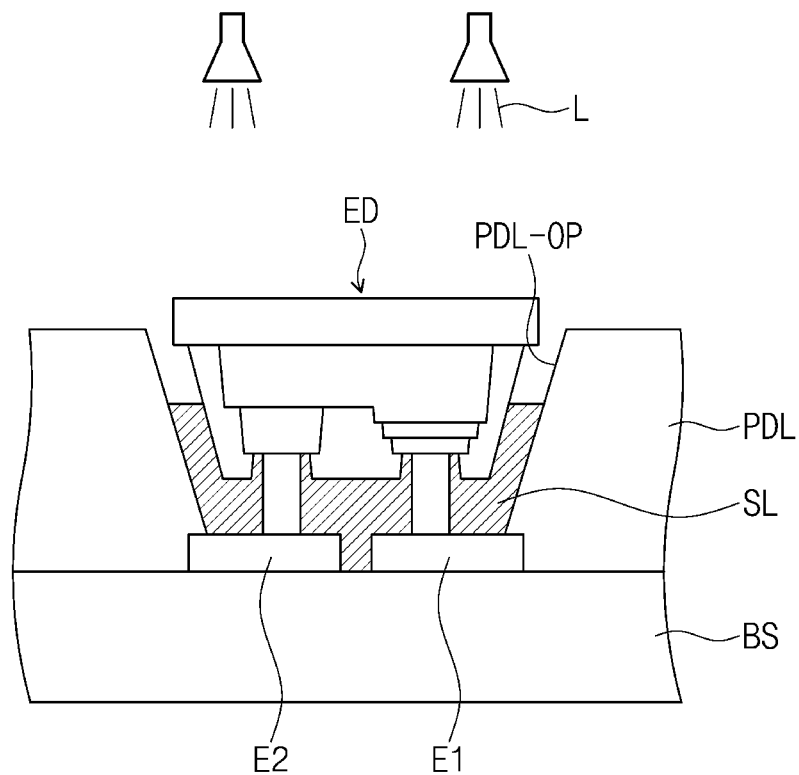

Referring to FIGS. 9, 10C, and 10D, a process is included in which the light emitting element ED is transferred such that the light emitting element ED passes through the solution layer SL so as to be electrically connected to the electrodes E1 and E2. The light emitting element ED may include the contact parts CT1 and CT2 (see FIG. 7), and the contact parts CT1 and CT2 may be transferred to contact the electrodes E1 and E2. In further detail, the contact parts CT1 and CT2 may include the first contact part CT1 and the second contact part CT2, and be transferred such that the first contact part CT1 is connected to the first electrode E1 and the second contact part CT2 is connected to the second electrode E2. In an embodiment, in the process in which the light emitting element ED is transferred, as the light emitting element ED passes through the solution layer SL to be transferred, the contact parts CT1 and CT2 and the electrodes E1 and E2 of the light emitting element ED may be buried in the solution layer SL, and entirely covered by the solution layer SL.

Referring to FIGS. 9 and 10D, a process is included in which light L or heat is applied to a part at which the light emitting element ED is connected with the electrodes E1 and E2, and bonds them. The light L or heat may be applied to a part at which the contact parts CT1 and CT2 of the light emitting element ED contact the electrodes E1 and E2. In an embodiment, the electrodes E1 and E2 may be formed of copper (Cu) or gold (Au), the contact parts CT1 and CT2 may be formed of an alloy of tin (Sn), and, in the process of applying the light L or heat, the metals forming the contact parts CT1 and CT2 and the electrodes E1 and E2 are melted and combined to each other. In an embodiment, the light L may be applied through an infrared (IR) laser. In FIG. 10D, the light L is exemplarily illustrated as being applied to the part at which the light emitting element ED is connected with the electrodes E1 and E2, but embodiments of the inventive concept are not limited thereto. The heat may be applied to the part at which the light emitting element ED is connected with the electrodes E1 and E2, and bond them. The heat may be applied through any one among an IR reflow oven, a convection oven, and a hot plate, for example.

In the manufacturing method of a display device according to an embodiment of the inventive concept, a process may be included in which, when the contact part of the light emitting element, which includes a metal, and the electrode, are bonded, a part to be bonded is melted and combined using the light or heat. For example, in the manufacturing method of a display device according to an embodiment, a process may be included in which a part to be bonded at which the contact part of the light emitting element and the electrode are connected is melted by irradiating with an IR laser and then are combined. In the manufacturing method of a display device according to an embodiment, since a contact portion between the contact part and the electrode is covered with the solution layer, the part to be bonded is prevented or substantially prevented from being oxidized, and the bonding with the IR laser may be simplified. In addition, in the manufacturing method of a display device according to an embodiment, the solution layer includes the light blocking material to prevent or substantially prevent the IR laser from being irradiated onto a part other than the bonding part, and external light may be effectively blocked to resolve the issue that the electrode or the like disposed in the inside is viewed from the outside.

Figure 10E:
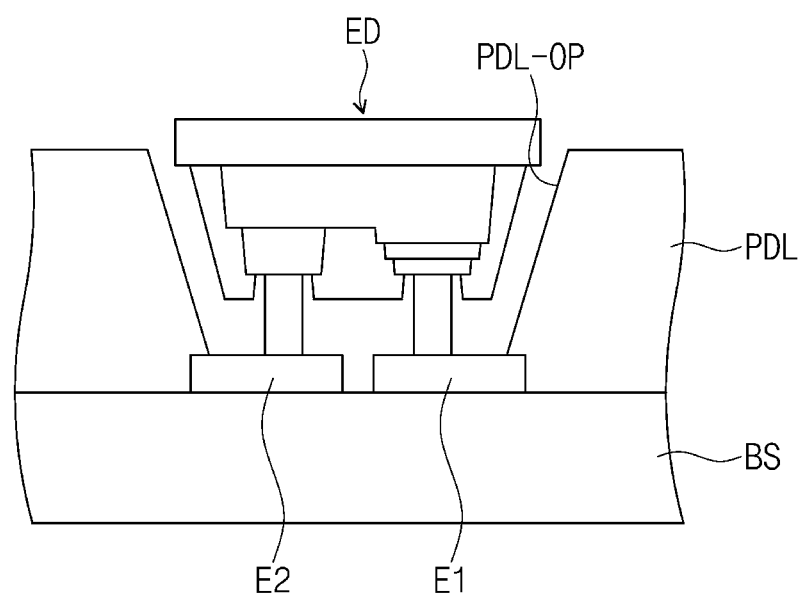

Referring to FIGS. 10D and 10E, in the manufacturing method of a display device according to an embodiment, a process of removing the solution layer SL may be further included after the process of bonding the light emitting element ED and the electrodes E1 and E2. The solution layer SL may be removed through a cleaning material selected according to the property of the solvent included in the solution forming the solution layer SL. In an embodiment, the solution layer SL may be formed of a solution containing a water-soluble solvent, and removed by cleaning with water after the bonding process. In another embodiment, the solution layer SL may be formed of a solution containing an organic solvent, and removed by cleaning with ethanol or acetone after the bonding process.

According to embodiments of the inventive concept, an issue that incident external light may be transmitted through a transparent LED and reflected by a reflection electrode and, thus, a user may view an internal configuration including the reflection electrode or the like, may be prevented or substantially prevented, and, accordingly, the reliability of the display device may be improved.

While the present invention has been described with reference to some example embodiments thereof, it will be understood by those of ordinary skill in the art to which the invention pertains that various changes and modifications may be made to the above-described embodiments without departing from the spirit and technical area of the invention as set forth in the appended claims and their equivalents.

Thus, the scope of the inventive concept shall not be restricted or limited by the foregoing description, but be determined by the broadest permissible interpretation of the claims.

What is claimed is:

1. A display device comprising:
   a base substrate;
   an electrode on the base substrate;
   a light emitting element on the base substrate and electrically connected to the electrode, the light emitting element comprising a main body part and a contact part, the contact part being in contact with the electrode so as to be electrically connected to the electrode; and
   a solution layer between the base substrate and the light emitting element and in direct contact with the contact part,
   wherein the solution layer comprises a solvent and a light blocking material dispersed or decomposed in the solvent.

2. The display device of claim 1,
   wherein the solution layer surrounds the contact part.

3. The display device of claim 2,
   wherein the electrode comprises a first electrode and a second electrode spaced apart from the first electrode, and
   the contact part comprises:
   a first contact part connected to the first electrode; and
   a second contact part connected to the second electrode.

4. The display device of claim 3, wherein the light emitting element further comprises:
   a base layer;
   a first semiconductor layer on the base layer;
   a second semiconductor layer on the first semiconductor layer;

a first element electrode on the second semiconductor layer and connected to the first contact part; and a second element electrode on the first semiconductor layer and connected to the second contact part.

5. The display device of claim 4, wherein the light emitting element further comprises an element insulation layer covering at least a part of the first element electrode and the second element electrode, and the solution layer is in contact with the first contact part, the second contact part, and the element insulation layer.

6. The display device of claim 1, wherein the electrode comprises gold or copper.

7. The display device of claim 1, wherein the solution layer comprises a water-soluble solvent and a sodium salt dissolved in the water-soluble solvent, wherein the sodium salt has a black color.

8. The display device of claim 1, wherein the solution layer comprises an organic solvent and a black organic pigment dispersed in the organic solvent.

9. The display device of claim 1, further comprising:

a pixel definition layer on the base substrate and covering a part of the electrode, wherein an opening which exposes a portion other than the part of the electrode is defined in the pixel definition layer, and the light emitting element and the solution layer are located in the opening.

10. The display device of claim 1, wherein the light emitting element is a micro LED element.

11. The display device of claim 1, further comprising a planarization layer on the light emitting element and the solution layer.

12. The display device of claim 2, wherein the contact part comprises tin, and further comprises at least one of copper, silver, or gold.

13. A manufacturing method of a display device, the manufacturing method comprising:

forming an electrode on a base substrate;

forming a solution layer by providing a solution comprising a solvent and a light blocking material dispersed or decomposed in the solvent on the electrode;

transferring a light emitting element into the solution layer such that the solution layer is in direct contact with a contact part of the light emitting element and the contact part is in contact with the electrode so as to be electrically connected to the electrode; and bonding the light emitting element with the electrode by applying light or heat to a part at which the light emitting element is connected to the electrode.

14. The manufacturing method of claim 13, wherein the electrode comprises copper or gold, the contact part comprises tin, and during the applying the light or the heat, the contact part is bonded with the electrode.

15. The manufacturing method of claim 13, wherein, during the forming of the electrode, a first electrode and a second electrode spaced apart from the first electrode are formed, the contact part comprises a first contact part, and a second contact part spaced apart from the first contact part, and during the transferring of the light emitting element, the transferring is performed such that the first contact part is connected to the first electrode, and the second contact part is connected to the second electrode.

16. The manufacturing method of claim 13, wherein, during the transferring of the light emitting element, the transferring is performed such that the contact part and the electrode are entirely covered with the solution layer.

17. The manufacturing method of claim 13, further comprising removing the solution layer, after the bonding of the light emitting element and the electrode.

18. The manufacturing method of claim 13, further comprising:

forming, on the base substrate, a pixel definition layer covering a part of the electrode, wherein, during the transferring of the light emitting element, the light emitting element is transferred into an opening of the pixel definition layer, the opening being defined to expose a portion other than the part of the electrode.

19. The manufacturing method of claim 13, wherein, during the bonding of the light emitting element and the electrode, the part at which the light emitting element is connected to the electrode is irradiated with light through an infrared laser, or is applied with heat through at least one of an IR reflow oven, a convection oven, or a hot plate.

20. The display device of claim 1, wherein the solution layer is in direct contact with the main body part and covers a bottom surface and a part of a side surface of the main body part.

* * * * *